(12) United States Patent
Hane et al.

(10) Patent No.: US 11,171,014 B2
(45) Date of Patent: Nov. 9, 2021

(54) SUBSTRATE PROCESSING METHOD AND SUBSTRATE PROCESSING APPARATUS

(71) Applicant: TOKYO ELECTRON LIMITED, Tokyo (JP)

(72) Inventors: Hideomi Hane, Yamanashi (JP); Kentaro Oshimo, Yamanashi (JP); Shimon Otsuki, Iwate (JP); Jun Ogawa, Yamanashi (JP); Noriaki Fukiage, Yamanashi (JP); Hiroaki Ikegawa, Yamanashi (JP); Yasuo Kobayashi, Yamanashi (JP); Takeshi Oyama, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 47 days.

(21) Appl. No.: 16/002,081

(22) Filed: Jun. 7, 2018

(65) Prior Publication Data
US 2018/0358235 A1    Dec. 13, 2018

(30) Foreign Application Priority Data

Jun. 9, 2017 (JP) .............................. JP2017-114467

(51) Int. Cl.
*H01L 21/32* (2006.01)
*H01L 21/3213* (2006.01)
(Continued)

(52) U.S. Cl.
CPC .. *H01L 21/32139* (2013.01); *H01J 37/32449* (2013.01); *H01J 37/32715* (2013.01); *H01J 37/32834* (2013.01); *H01L 21/022* (2013.01); *H01L 21/02252* (2013.01); *H01L 21/32136* (2013.01); *H01J 2237/334* (2013.01);
(Continued)

(58) Field of Classification Search
CPC ............... H01L 21/0217; H01L 21/022; H01L 21/02211; H01L 21/02252; H01L 21/02274; H01L 21/0228; H01L 21/0234; H01L 21/32136; H01L 21/32139
See application file for complete search history.

(56) References Cited

U.S. PATENT DOCUMENTS 6,503,830 B2 * 1/2003 Miyata .............. H01L 21/76811
257/E21.579
7,078,351 B2 * 7/2006 Chiu ................... H01L 21/0276
438/736
(Continued)

FOREIGN PATENT DOCUMENTS

JP 2010-177480 A 8/2010
JP 5231232 B2 7/2013
(Continued)

*Primary Examiner* — Mohammed Shamsuzzaman
(74) *Attorney, Agent, or Firm* — Nath, Goldberg & Meyer; Jerald L. Meyer; Tanya E. Harkins

(57) ABSTRACT

There is provided a substrate processing method, including: forming a silicon nitride film laminated on an etching target film by supplying a film forming gas to a substrate; oxidizing a surface of the silicon nitride film to form an oxide layer by supplying an oxidizing gas to the substrate; and etching the etching target film by supplying an etching gas containing halogen to the substrate, in a state in which the etching target film and the oxide layer are exposed on a surface of the substrate.

4 Claims, 14 Drawing Sheets

(51) Int. Cl.
*H01L 21/02* (2006.01)
*H01J 37/32* (2006.01)

(52) U.S. Cl.
CPC ...... *H01L 21/0217* (2013.01); *H01L 21/0228* (2013.01); *H01L 21/0234* (2013.01); *H01L 21/02211* (2013.01); *H01L 21/02274* (2013.01)

(56) References Cited

U.S. PATENT DOCUMENTS

| | | | | |
|---|---|---|---|---|
| 8,916,054 | B2* | 12/2014 | Brink | H01L 21/31144 |
| | | | | 216/47 |
| 9,478,506 | B2* | 10/2016 | Farrell | H01L 23/564 |
| 2002/0173163 | A1* | 11/2002 | Gutsche | H01L 21/0334 |
| | | | | 438/736 |
| 2005/0191852 | A1 | 9/2005 | Takigawa et al. | |
| 2006/0009025 | A1* | 1/2006 | Kanamura | H01L 21/76811 |
| | | | | 438/618 |
| 2006/0094248 | A1* | 5/2006 | Nishita | H01L 21/02238 |
| | | | | 438/758 |
| 2008/0176413 | A1* | 7/2008 | Sasaki | H01L 21/0214 |
| | | | | 438/792 |
| 2012/0187546 | A1* | 7/2012 | Akinmade-Yusuff | ......... |
| | | | | H01L 21/31144 |
| | | | | 257/622 |
| 2013/0084712 | A1* | 4/2013 | Yuasa | H01L 21/02532 |
| | | | | 438/763 |

FOREIGN PATENT DOCUMENTS

| | | | |
|---|---|---|---|
| JP | 2015-180768 | A | 10/2015 |
| KR | 1020110035935 | A | 4/2011 |
| KR | 1020150105216 | A | 9/2015 |

\* cited by examiner

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2017-114467, filed on Jun. 9, 2017, the entire contents of which are incorporated herein by reference.

TECHNICAL FIELD

The present disclosure relates to a technique including a process of forming a silicon nitride film on a substrate.

BACKGROUND

In a manufacturing process of a semiconductor device, a silicon nitride (SiN) film is formed on a semiconductor wafer (hereinafter referred to as a wafer) which is a substrate, and an etching is performed in a state in which the SiN film and an etching target film are exposed on the surface of the wafer. A method has been used in which a SiN film is formed on a Si (silicon) film, a recess is formed in the SiN film so that the Si film is exposed, and a plasma oxidizing process is performed to oxidize the exposed Si film.

The etching target film may be, for example, a TiN (titanium nitride) film. As an etching gas for etching the TiN film, for example, a chlorine-based gas is used. However, when such a chlorine-based gas is used, the etching selection ratio between the SiN film and the TiN film becomes relatively small. Therefore, it is required to increase the etching resistance of the SiN film.

SUMMARY

Some embodiments of the present disclosure provide a technique capable of suppressing the etching of a silicon nitride film when a substrate on which an etching target film and a silicon nitride film are exposed is etched using a halogen gas.

According to one embodiment of the present disclosure, there is provided a substrate processing method, including: forming a silicon nitride film laminated on an etching target film by supplying a film forming gas to a substrate; oxidizing a surface of the silicon nitride film to form an oxide layer by supplying an oxidizing gas to the substrate; and etching the etching target film by supplying an etching gas containing halogen to the substrate, in a state in which the etching target film and the oxide layer are exposed on a surface of the substrate.

According to another embodiment of the present disclosure, there is provided a substrate processing apparatus for executing the substrate processing method, including: a rotary table installed in a vacuum container and configured to mount and rotate a substrate; a raw material gas supply part configured to supply a silicon-containing raw material gas as the film forming gas to a first region on the rotary table; a nitriding gas supply part configured to supply a nitriding gas for nitriding the raw material gas and generating a silicon nitride to a second region spaced apart from the first region in a rotation direction of the rotary table on the rotary table; a separation mechanism configured to separate an atmosphere of the first region from an atmosphere of the second region; an oxidizing gas supply part configured to supply the oxidizing gas onto the rotary table; and a controller configured to output a control signal so that the oxidizing gas is supplied onto the rotary table after the substrate has repeatedly passed through the first region and the second region a plurality of times in a state in which the raw material gas and the nitriding gas are supplied onto the rotary table.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1A:
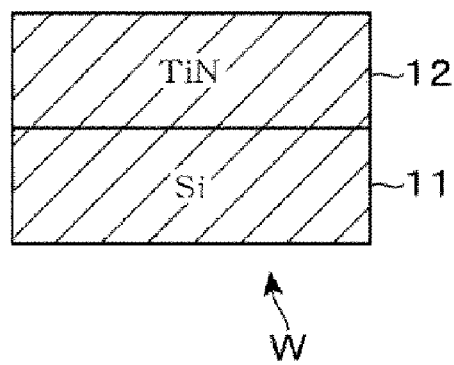
FIGS. 1A to 1C are vertical sectional side views of a wafer showing processing steps according to an embodiment of the present disclosure.
Figure 1B:
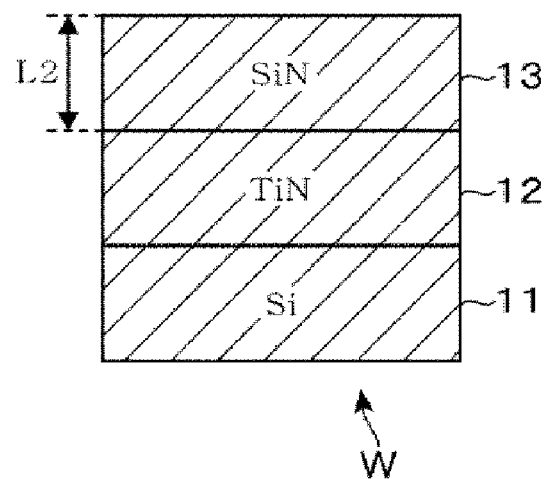
Figure 1C:
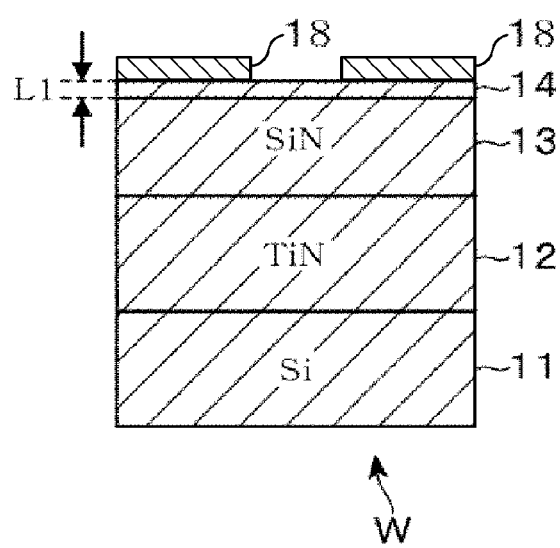

One embodiment of a substrate processing method of the present disclosure will be described with reference to the process diagrams of FIGS. 1A to 1C and 2A and 2B showing a vertical sectional side surface of a wafer W which is a substrate made of, for example, Si. First, a TiN (titanium nitride) film 12 is formed on a Si layer 11 forming the surface of the wafer W (FIG. 1A). Thereafter, a SiN (silicon nitride) film 13 is formed on the TiN film 12 (FIG. 1B). In this specification, silicon nitride will be described as SiN regardless of the stoichiometric ratio of Si and N. Accordingly, the description of SiN includes, for example, $Si_3N_4$. Subsequently, the surface layer of the SiN film 13 is oxidized, and the surface layer is limitedly formed into an oxide layer 14 made of SiON (FIG. 1C).

Figure 2A:
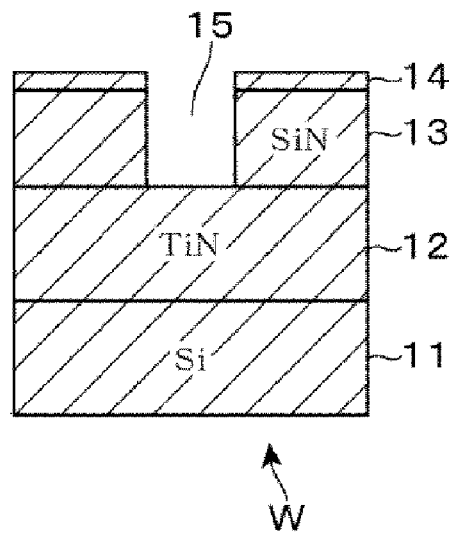
FIGS. 2A and 2B are vertical sectional side views of a wafer showing processing steps according to an embodiment of the present disclosure.
Figure 2B:
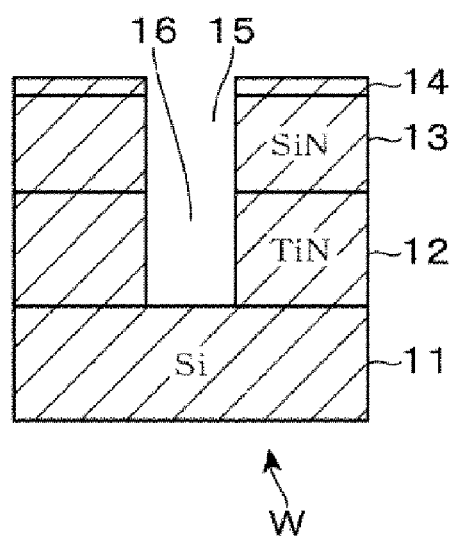

Thereafter, a resist film is formed on the oxide layer 14. The resist film is exposed and then developed so that a resist pattern 18 is formed in the resist film (FIG. 1C). Thereafter, the SiN film 13 and the oxide layer 14 are etched along the resist pattern 18, whereby an opening 15 is formed in the SiN film 13 and the oxide layer 14. Further, the resist film is removed after forming the opening 15 or in parallel with the formation of the opening 15 (FIG. 2A). As shown in FIG. 2A, the TiN film 12 is exposed on the surface of the wafer W via the opening 15, whereby both the oxide layer 14 and the TiN film 12 are exposed on the surface of the wafer W. The SiN film 13 and the oxide layer 14 are a mask for etching the TiN film 12 which is an etching target film. Accordingly, the opening 15 forms a mask pattern formed in the mask.

Thereafter, a Cl (chlorine)-based gas is supplied to the wafer W as an etching gas. The TiN film 12 is etched. An opening 16 is formed in the TiN film 12. For example, the Si layer 11 is exposed (FIG. 2B)). The Cl-based gas is a gas containing Cl. Specific examples of the Cl-based gas include chlorine ($Cl_2$), hydrogen chloride (HCl), dichlorosilane (DCS), tetrachlorosilane ($SiCl_4$), hexachlorodisilane ($Si_2Cl_6$), trichlorosilane ($SiHCl_3$), boron trichloride ($BCl_3$), and the like.

The reason why the TiN film 12 is etched by the Cl-based gas after forming the surface portion of the SiN film 13 as the oxide layer 14 in this manner will be described in detail. The bonding energy between Si and N constituting the SiN film 13 is 4.5 eV, which is close to 4.21 eV which is the bonding energy between Si and Cl. Therefore, if the etching gas is supplied to the wafer W and the TiN film 12 is etched without forming the oxide layer 14, the breakage of the bond between Si and N in the SiN film 13 and the bonding of Si in the SiN film 13 and Cl in the etching gas are relatively likely to occur. That is, the SiN film 13 becomes $SiCl_4$ and is easily etched from the wafer W.

However, the bonding energy between Si and O in SiON which is the oxide layer 14 is 8.29 eV, which is larger than 4.21 eV which is the bonding energy between Si and Cl. Therefore, the oxide layer 14 has lower reactivity with Cl contained in the etching gas. Thus, the oxide layer 14 is hardly etched. Accordingly, by forming the oxide layer 14 as described above, it is possible to etch the TiN film 12 while preventing the SiN film 13 from being etched. That is, by forming the oxide layer 14, it is possible to increase the etching selection ratio of the TiN film to the SiN film.

The entire SiN film 13 may be formed as the oxide layer 14. However, when oxidized, the characteristics of SiN are changed. For example, the etching resistance to a hydrofluoric acid becomes low. Therefore, in order to prevent etching by the etching gas while maintaining the characteristics as the SiN film, it is preferable to oxidize only the surface layer of the SiN film 13 as described above. For example, if the thickness of the oxide layer 14 is L1 and the thickness of the SiN film before the formation of the oxide layer 14 is L2 as shown in FIGS. 1B and 1C, it is preferable to perform the process to obtain $L1/L2 \leq 1/3$.

Figure 3:
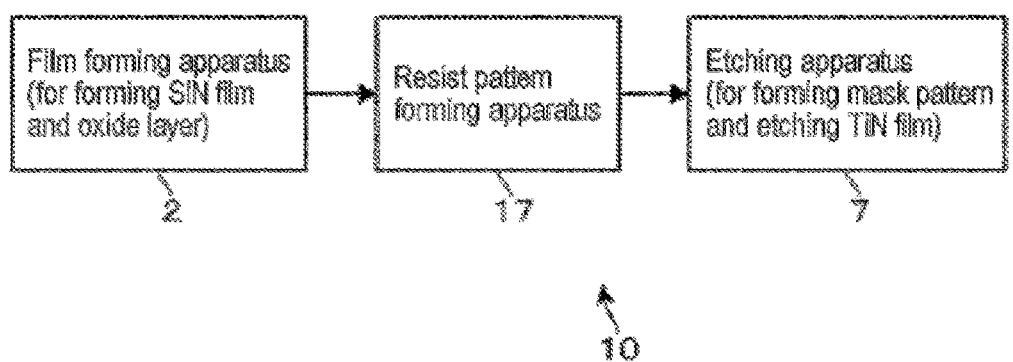
FIG. 3 is a block diagram of a system for performing the processing steps.

FIG. 3 is a block diagram of a system 10 that performs the series of processes described above. The system 10 includes a film forming apparatus 2, a resist pattern forming apparatus 17 and an etching apparatus 7. A wafer W stored in a carrier is transferred and processed in the order of the film forming apparatus 2, the resist pattern forming apparatus 17 and the etching apparatus 7. The film forming apparatus 2 performs the formation of the SiN film 13 and the formation of the oxide layer 14 described with reference to FIGS. 1A to 1C. In the resist pattern forming apparatus 17, resist film formation on the wafer W by applying a resist, exposure processing and development processing are sequentially performed, and the resist pattern 18 is formed on the oxide layer 14 as described above. The etching apparatus 7 performs the etching of the SiN film 13 and the oxide layer 14, the removal of the resist film, and the etching of the TiN film 12 as described with reference to FIGS. 2A and 2B.

Figure 4:
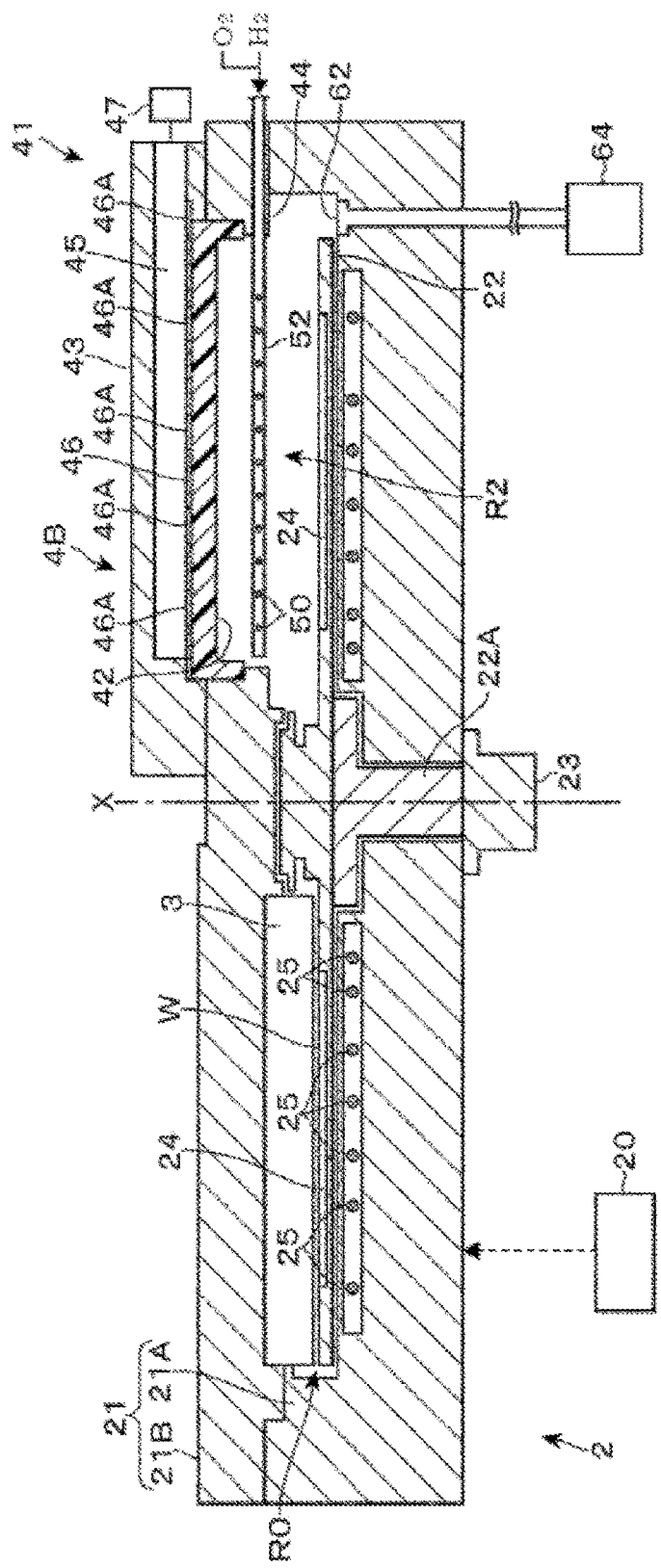
FIG. 4 is a vertical sectional side view of a film forming apparatus for performing a film forming process and an oxidizing process in the processing steps.

Subsequently, the film forming apparatus 2 will be described with reference to a vertical sectional side view of FIG. 4 and a horizontal sectional plan view of FIG. 5. This film forming apparatus 2, which is an embodiment of the substrate processing apparatus of the present disclosure, performs the formation of the SiN film 13 by ALD (Atomic Layer Deposition). In FIG. 4, reference numeral 21 denotes a flat substantially-circular vacuum container (processing container), which is formed of a container body 21A constituting a side wall and a bottom portion and a top plate 21B. Reference numeral 22 in FIG. 4 denotes a circular rotary table provided horizontally in the vacuum container 21. Reference numeral 22A in FIG. 4 denotes a support portion that supports the central portion of the rear surface of the rotary table 22. Reference numeral 23 in FIG. 4 denotes a rotation mechanism, which rotates the rotary table 22 clockwise in a plan view in the circumferential direction through the support portion 22A during a film forming process. X in FIG. 4 represents the rotation axis of the rotary table 22.

On an upper surface of the rotary table 22, six circular recesses 24 are provided along the circumferential direction (rotation direction) of the rotary table 22, and the wafers W are stored in the respective recesses 24. That is, the respective wafers W are mounted on the rotary table 22 so as to revolve by the rotation of the rotary table 22. Reference numeral 25 in FIG. 4 denotes heaters, which are provided concentrically in the bottom portion of the vacuum container 21 to heat the wafers W mounted on the rotary table 22. Reference numeral 26 in FIG. 5 denotes a transfer port of the wafer W which is opened on the side wall of the vacuum container 21 and which is configured to be opened and closed by a gate valve (not shown). The wafer W is delivered between the outside of the vacuum container 21 and the inside of the recess 24 via the transfer port 26 by a substrate transfer mechanism (not shown).

On the rotary table 22, a gas supply/exhaust unit 3, a plasma forming unit 4A, a plasma forming unit 4B and a plasma forming unit 4C are provided in the named order along the rotation direction of the rotary table 22 toward the downstream side in the rotation direction of the rotary table 22. The gas supply/exhaust unit 3 is a unit that supplies a DCS gas, which is a raw material gas for forming the SiN film 13, to the wafer W. The plasma forming units 4A to 4C are units for converting a plasma forming gas supplied to the rotary table 22 into plasma and performing plasma processing on the wafer W. The plasma forming unit 4C performs plasma processing for nitriding the DCS gas adsorbed to the wafer W to form the SiN film 13, and the plasma forming units 4A and 4B perform plasma processing for modifying the SiN film 13. These plasma forming units 4A to 4C also perform a plasma oxidizing process for forming the above-mentioned oxide layer 14.

The configuration of the gas supply/exhaust unit 3 will be described with reference also to FIG. 6 which is a vertical sectional side view and FIG. 7 which is a bottom view. The gas supply/exhaust unit 3 is formed in a fan shape that gradually becomes wider from a center side to a peripheral edge side of the rotary table 22 in the circumferential direction of the rotary table 22 when seen in a plan view. A lower surface of the gas supply/exhaust unit 3 adjoins and faces the upper surface of the rotary table 22.

A plurality of gas discharge ports 31 constituting a discharge part, an exhaust port 32 and a purge gas discharge port 33 are opened in the lower surface of the gas supply/exhaust unit 3. In FIG. 7, in order to facilitate discrimination in the figure, a large number of dots are given to the exhaust port 32 and the purge gas discharge port 33. The plurality of gas discharge ports 31 are arranged in a fan-shaped region 34 on an inner side of a peripheral edge portion of the lower surface of the gas supply/exhaust unit 3. The gas discharge ports 31 discharge the DCS gas downward in a shower shape and supply the DCS gas to the entire surface of the wafer W during the rotation of the rotary table 22 in the film forming process.

In this fan-shaped region 34, three zones 34A, 34B and 34C are set from the center side of the rotary table 22 toward the peripheral edge side of the rotary table 22. The gas supply/exhaust unit 3 is provided with gas flow paths 35A, 35B and 35C, which are partitioned from each other, so that the DCS gas can be independently supplied to the respective gas discharge ports 31 provided in the respective zones 34A, 34B and 34C. Downstream ends of the respective gas flow paths 35A, 35B and 35C are configured as the gas discharge ports 31.

Respective upstream sides of the gas flow paths 35A, 35B and 35C are connected to a DCS gas supply source 36 via pipes. A gas supply device 37 constituted by a valve and a mass flow controller is provided in each pipe. The supply and stop of the DCS gas to the downstream side in each of the gas flow paths 35A, 35B and 35C and the flow rate of the DCS gas supplied from the DCS gas supply source 36 are controlled by the gas supply devices 37. The respective gas supply devices other than the gas supply device 37, which will be described later, are configured similarly to the gas supply device 37 so as to control the flow of the gas to the downstream side and the flow rate of the gas.

Subsequently, the exhaust port 32 and the purge gas discharge port 33 will be described. The exhaust port 32 and the purge gas discharge port 33 are annularly opened in the peripheral edge portion of the lower surface of the gas supply/exhaust unit 3 so as to surround the fan-shaped region 34 and face the upper surface of the rotary table 22. The purge gas discharge port 33 is located outside the exhaust port 32. A region inside the exhaust port 32 on the rotary table 22 forms an adsorption region R0 where adsorption of DCS to the surface of the wafer W is performed. The purge gas discharge port 33 discharges, a purge gas, for example, an Ar (argon) gas onto the rotary table 22.

During the film forming process, the discharge of a raw material gas from the gas discharge ports 31, the exhaust from the exhaust port 32 and the discharge of a purge gas from the purge gas discharge port 33 are performed simultaneously. As a result, the raw material gas and the purge gas discharged toward the rotary table 22 as indicated by arrows in FIG. 6 flow to the exhaust port 32 on the upper surface of the rotary table 22 and exhausted from the exhaust port 32. By performing the discharge and exhaust of the purge gas in this manner, the atmosphere in the adsorption region R0 is separated from the external atmosphere, thereby making it possible to limit the supply of the raw material gas to the adsorption region R0. That is, it is possible to suppress the mixing of the DCS gas supplied to the adsorption region R0 with gases and active species of the gases supplied outside of the adsorption region R0 by the plasma forming units 4A to 4C as described later. Therefore, it is possible to perform the film forming process on the wafer W by ALD as described later. In this manner, the gas supply/exhaust unit 3 constitutes a raw material gas supply part that supplies the raw material gas to the rotary table 22 and a separation mechanism that separates the atmosphere of the adsorption region R0 from the atmosphere outside the adsorption region R0.

Figure 6:
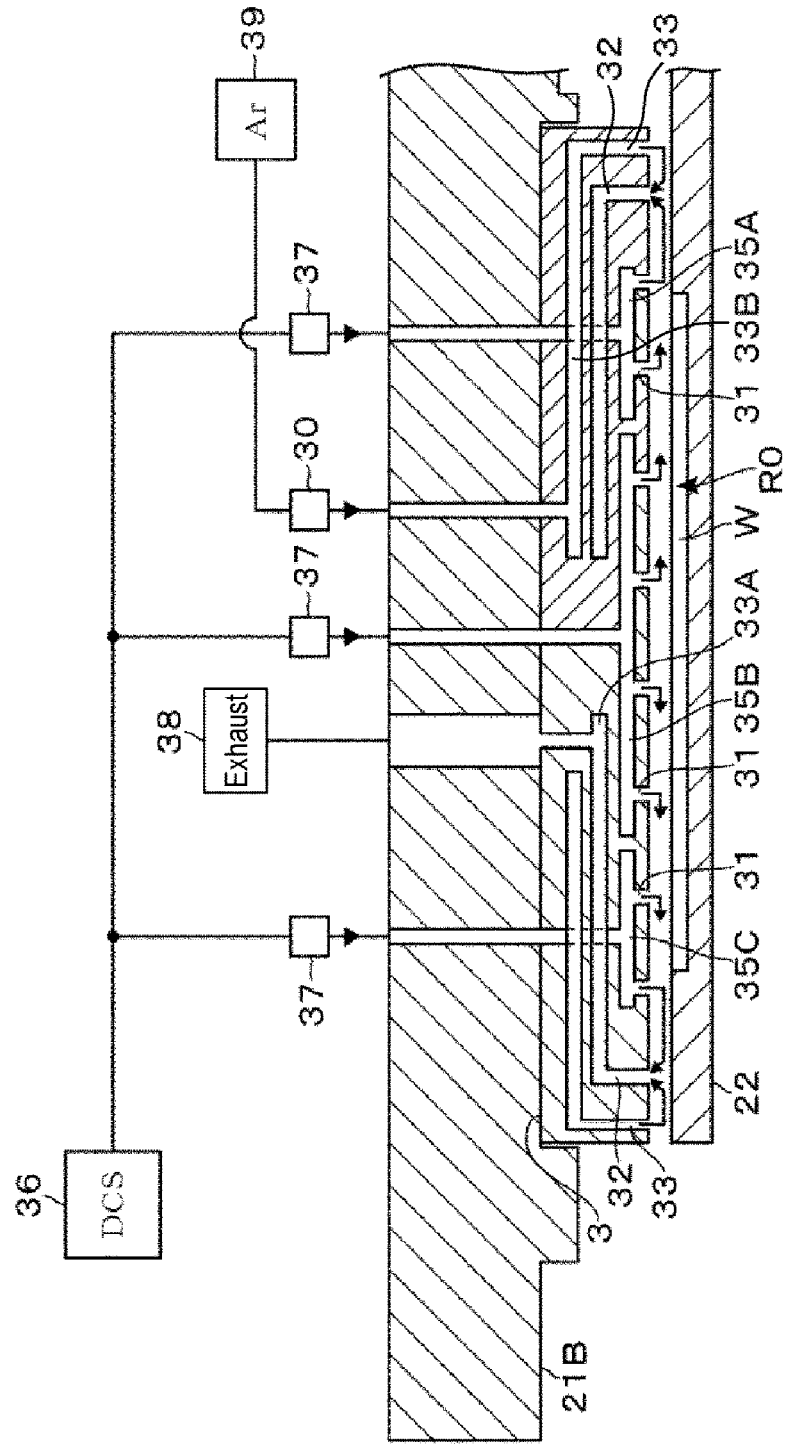
FIG. 6 is a vertical sectional side view of a gas shower head provided in the film forming apparatus.
Figure 7:
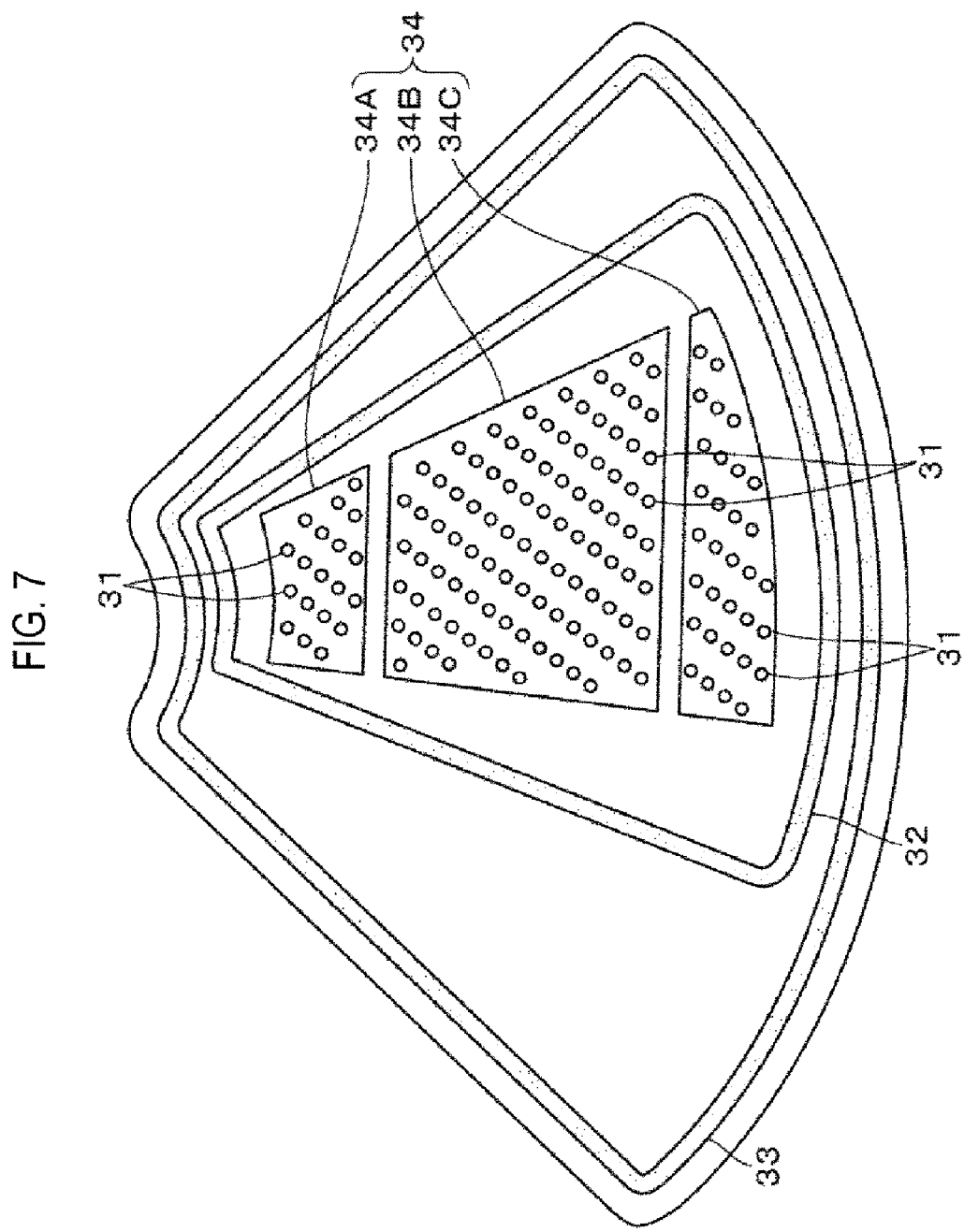
FIG. 7 is a bottom view of the gas shower head.

In FIG. 6, reference numerals 33A and 33B denote gas flow paths provided in the gas supply/exhaust unit 3 and partitioned from one another. The gas flow paths 33A and 33B are also partitioned from the flow paths 35A to 35C of the raw material gas. An upstream end of the gas flow path 33A is connected to the exhaust port 32, and a downstream end of the gas flow path 33A is connected to an exhaust device 38. The exhaust device 38 performs exhaust of a gas from the exhaust port 32. A downstream end of the gas flow path 33B is connected to the purge gas discharge port 33, and an upstream end of the gas flow path 33B is connected to an Ar gas supply source 39. A gas supply device 30 is provided in a pipe that connects the gas flow path 33B and the Ar gas supply source 39.

Subsequently, the plasma forming unit 4B constituting a plasma generating mechanism will be described with reference to FIGS. 4 and 5. The plasma forming unit 4B supplies a microwave to a plasma forming gas discharged from a gas injector to be describe later to a lower portion of the plasma forming unit 4B, thereby generating plasma above the rotary table 22. The plasma forming unit 4B is provided with an antenna 41 for supplying the microwave. The antenna 41 includes a dielectric plate 42 and a metal-made waveguide 43.

The dielectric plate 42 is formed in a substantially fan-like shape which gradually becomes wider from the center side of the rotary table 22 to the peripheral edge side of the rotary table 22 when seen in a plan view. A generally fan-shaped through hole is provided in the top plate 21B of the vacuum container 21 so as to correspond to the shape of the dielectric plate 42. An inner circumferential surface of a lower end portion of the through hole protrudes slightly toward a central portion of the through hole so as to form a support portion 44. The dielectric plate 42 is provided to close the through hole from the upper side and to face the rotary table 22. A peripheral edge portion of the dielectric plate 42 is supported by the support portion 44.

The waveguide 43 is provided on the dielectric plate 42 and has an internal space 45 extending on the top plate 21B. Reference numeral 46 in FIG. 4 denotes a slot plate constituting the lower side of the waveguide 43. The slot plate 46 is provided so as to make contact with the dielectric plate 42 and has a plurality of slot holes 46A. An end portion of the waveguide 43 on the center side of the rotary table 22 is closed. A microwave generator 47 is connected to an end portion of the waveguide 43 on the peripheral edge side of the rotary table 22. The microwave generator 47 supplies a microwave of, for example, about 2.45 GHz, to the waveguide 43.

The microwave passes through the slot holes 46A of the slot plate 46 and reaches the dielectric plate 42. The microwave is supplied to the plasma forming gas supplied from the gas injector to a lower side of the dielectric plate 42. Plasma is limitedly formed under the dielectric plate 42 so that the wafer W is processed. As described above, the lower side of the dielectric plate 42 forms a plasma forming region which is denoted as R2. The plasma forming units 4A and 4C are configured similarly to the plasma forming unit 4B. The regions in the plasma forming units 4A and 4C corresponding to the plasma forming region R2 are denoted as plasma forming regions R1 and R3, respectively. The plasma forming regions R1 to R3 correspond to a second region, and the adsorption region R0 described above corresponds to a first region.

Figure 5:
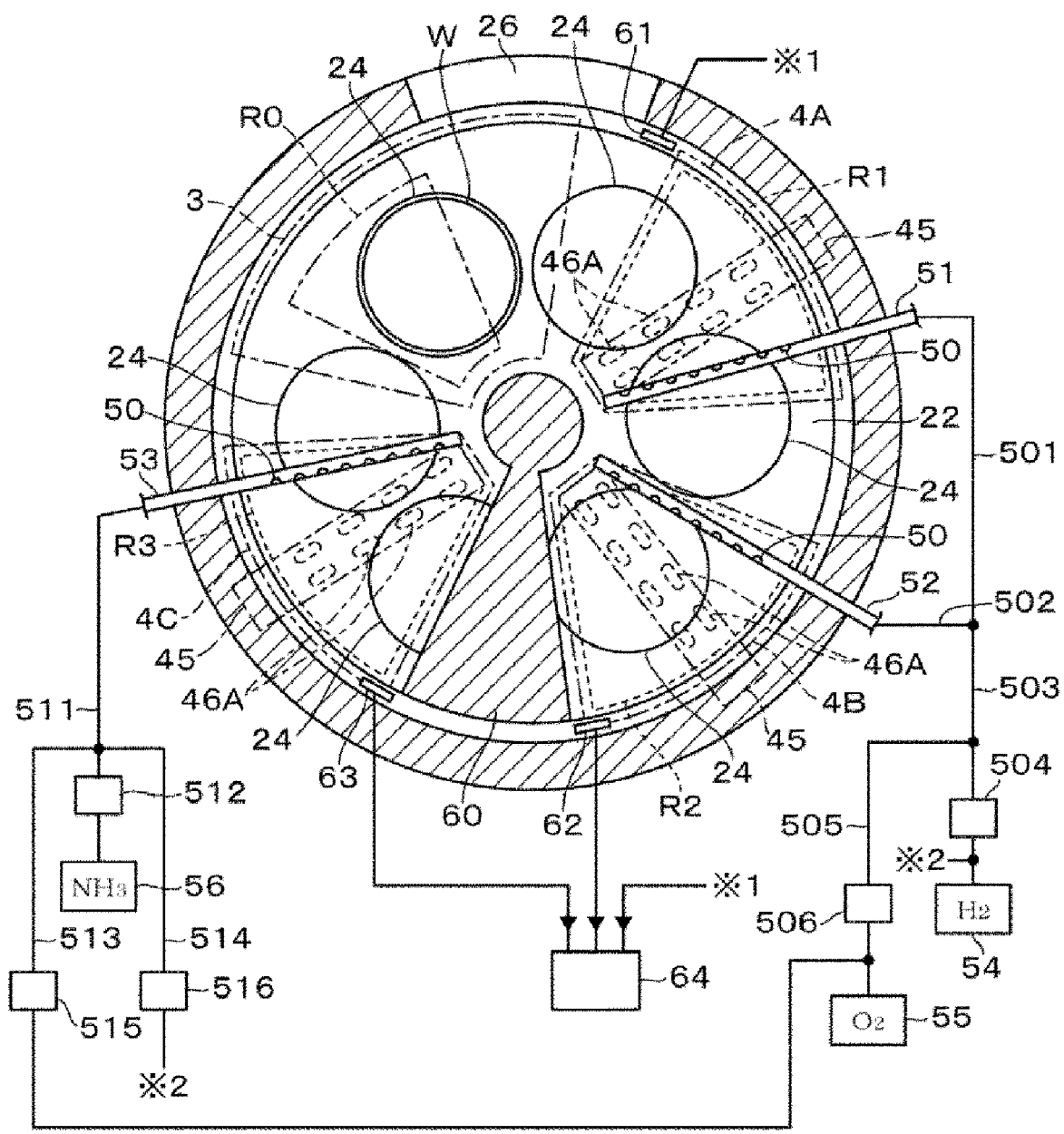
FIG. 5 is a horizontal sectional plan view of the film forming apparatus.
Figure 8:
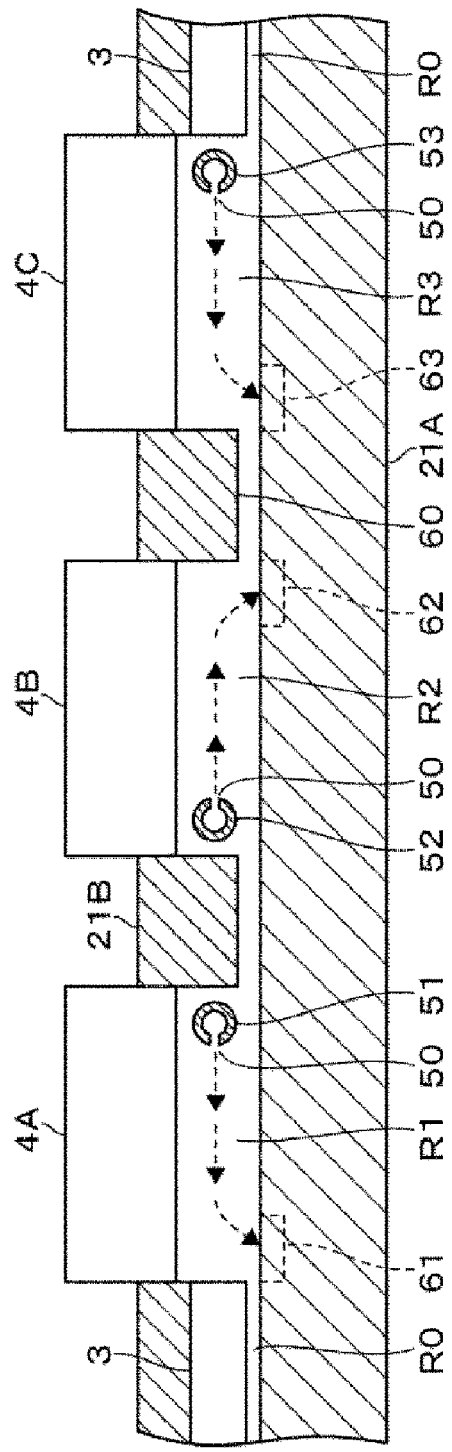
FIG. 8 is a schematic vertical sectional side view taken along the circumferential direction of the film forming apparatus.

As shown in FIG. 5, when viewed in the rotation direction of the rotary table 22, gas injectors 51, 52 and 53 are provided at a downstream end portion of the plasma forming region R1, an upstream end portion of the plasma forming region R2 and a downstream end portion of the plasma forming region R3, respectively. FIG. 8 is a schematic vertical sectional side view taken along the circumferential direction of the film forming apparatus 2. Description will be made with reference also to FIG. 8. The dotted line arrows in FIG. 8 indicate the flow of the gases discharged from the respective gas injectors 51 to 53.

The gas injectors 51, 52 and 53 are configured as, for example, elongated tubular bodies closed on the tip portion side thereof. The gas injectors 51, 52 and 53 extend horizontally from the side wall of the vacuum container 21 toward the central region. The gas injectors 51, 52 and 53 are provided so as to intersect the wafer passing region on the rotary table 22. In the gas injectors 51, 52 and 53, a plurality of gas discharge holes 50 are opened in the horizontal direction along the length direction thereof. When viewed in the rotation direction of the rotary table 22, the gas injector 51 discharges a gas to the plasma forming region R1 so that the gas flows toward an upstream side of the plasma forming region R1, the gas injector 52 discharges a gas to the plasma forming region R2 so that the gas flows toward a downstream side of the plasma forming region R2, and the gas injector 53 discharges a gas to the plasma forming region R3 so that the gas flows toward an upstream side of the plasma forming region R3.

In FIG. 5, reference numerals 501 and 502 denote pipes respectively connected to the gas injector 51 and the gas injector 52. Upstream sides of the pipes 501 and 502 are joined to form a confluent pipe 503 which is connected to an $H_2$ (hydrogen) gas supply source 54 via a gas supply device 504. A downstream end of a pipe 505 is connected to a downstream side of the gas supply device 504 in the confluent pipe 503. An upstream end of the pipe 505 is connected to an $O_2$ (oxygen) gas supply source 55 via a gas supply device 506. Accordingly, each $H_2$ gas and $O_2$ gas are discharged from the gas injectors 51 and 52. The $H_2$ gas discharged from the gas injectors 51 and 52 is a modifying gas for modifying the SiN film 13. The $O_2$ gas is an oxidizing gas for forming the oxide layer 14.

In FIG. 5, reference numeral 511 denotes a pipe connected to the gas injector 53. An upstream side of the pipe 511 is connected to an $NH_3$ gas supply source 56 via a gas supply device 512. The $NH_3$ gas is a reaction gas for making a nitriding reaction with the DCS gas adsorbed to the wafer W to generate SiN. Downstream ends of the pipes 513 and 514 are connected to the pipe 511 on the downstream side of the gas supply device 512. An upstream end of the pipe 513 is connected to the $O_2$ gas supply source 55 via a gas supply device 515. An upstream end of the pipe 514 is connected to the $H_2$ gas supply source 54 via a gas supply device 516. Accordingly, each of the $O_2$ gas as the oxidizing gas, the $H_2$ gas as the modifying gas, and the $NH_3$ gas are discharged from the gas injector 53. Therefore, the gas injectors 51 to 53 are configured as an oxidizing gas supply part for discharging an $O_2$ gas. The gas injector 53 is also configured as a nitriding gas supply part for discharging an $NH_3$ gas.

A separation region 60 is provided between the plasma forming region R2 and the plasma forming region R3. A ceiling surface of the separation region 60 is set to be lower than the ceiling surfaces of the plasma forming region R2 and the plasma forming region R3. As shown in FIG. 5, when seen in a plan view, the separation region 60 is formed in a fan shape gradually becoming wider from the center side of the rotary table 22 to the peripheral edge side of the rotary table 22 in the circumferential direction of the rotary table 22. The ceiling surface of the separation region 60 faces and adjoins the upper surface of the rotary table 22, whereby the conductance between the separation region 60 and the rotary table 22 is suppressed.

Further, as shown in FIG. 5, a first exhaust port 61, a second exhaust port 62 and a third exhaust port 63 are opened outside the rotary table 22 at the positions facing an upstream end portion of the plasma forming region R1, a downstream end portion of the plasma forming region R2 and an upstream end portion of the plasma forming region R3, respectively. The first exhaust port 61 exhausts the gas discharged from the gas injector 51 to the plasma forming region R1. The second exhaust port 62 exhausts the gas discharged from the gas injector 52 and existing in the plasma forming region R2. The second exhaust port 62 is provided near an upstream side of the separation region 60 in the rotation direction. The third exhaust port 63 exhausts the gas discharged from the gas injector 53 and existing in the plasma forming region R3. The third exhaust port 63 is provided near a downstream side of the separation region 60 in the rotation direction.

Since the conductance of the gap between the separation region 60 and the rotary table 22 is small as described above, the $H_2$ gas discharged from the gas injector 52 is prevented from flowing through the gap toward the downstream side in the rotation direction of the rotary table 22 and is exhausted from the second exhaust port 62 arranged as described above. Since the conductance is small in the same manner, the $NH_3$ gas and the $H_2$ gas discharged from the gas injector 53 are also prevented from flowing through the gap toward the upstream side in the rotation direction of the rotary table 22 and is exhausted from the third exhaust port 63 arranged as described above. Accordingly, the respective gases discharged from the gas injectors 52 and 53 are not mixed with one another but are exhausted from the second exhaust port 62 and the third exhaust port 63, respectively, whereby the reduction in the concentration of the $NH_3$ gas in the plasma forming region R3 is suppressed.

Reference numeral 64 in FIG. 5 denotes an exhaust device, which is formed of a vacuum pump or the like and is connected to the first exhaust port 61, the second exhaust port 62 and the third exhaust port 63 via an exhaust pipe. The degree of vacuum in the vacuum container 21 is adjusted by adjusting the exhaust amount of each of the exhaust ports 61 to 63 using a pressure adjusting part (not shown) provided in the exhaust pipe.

As shown in FIG. 4, the film forming apparatus 2 is provided with a controller 20 formed of a computer. A program is stored in the controller 20. In the program, a group of steps is incorporated so as to transmit control signals to the respective parts of the film forming apparatus 2 to control the operations of the respective parts so that the process to be described later is executed. More specifically, the rotation number of the rotary table 22 rotated by the rotation mechanism 23, the flow rate and the supply and stop of each of the gases controlled by the gas supply device, the exhaust amount controlled by each of the exhaust devices 38 and 64, the supply and stop of the microwave supplied from the microwave generator 47 to antenna 41, the power supply to the heater 25, and the like are controlled by the program. The control of the power supply to the heater 25 is the control of the temperature of the wafer W, and the control of the exhaust amount by the exhaust device 64 is the control of the pressure inside the vacuum container 21. The program is stored in a storage medium such as a hard disk, a compact disk, a DVD, a memory card or the like and is installed in the controller 20.

Figure 9:
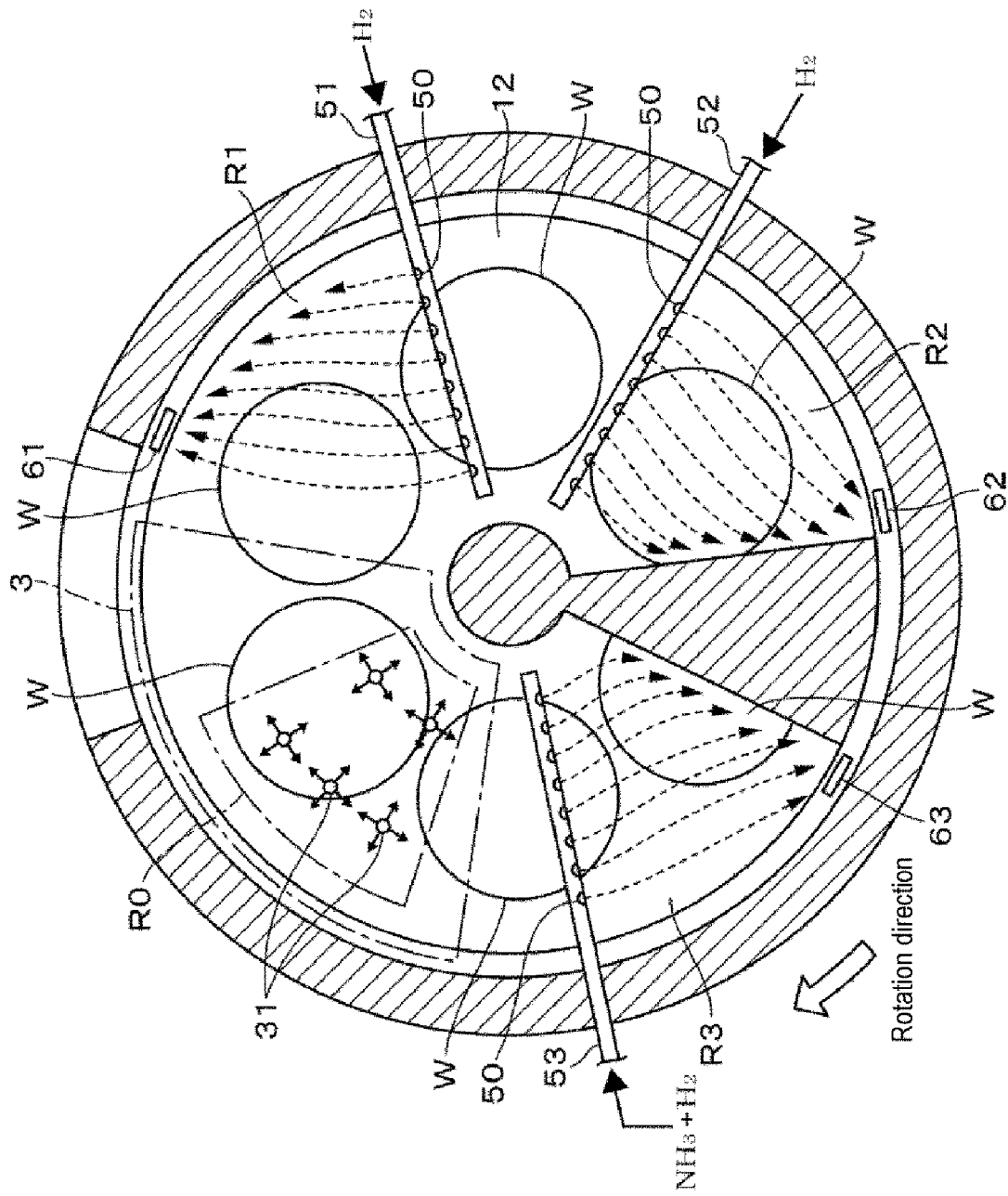
FIG. 9 is a plan view showing the film forming apparatus which is performing the film forming process.
Figure 10:
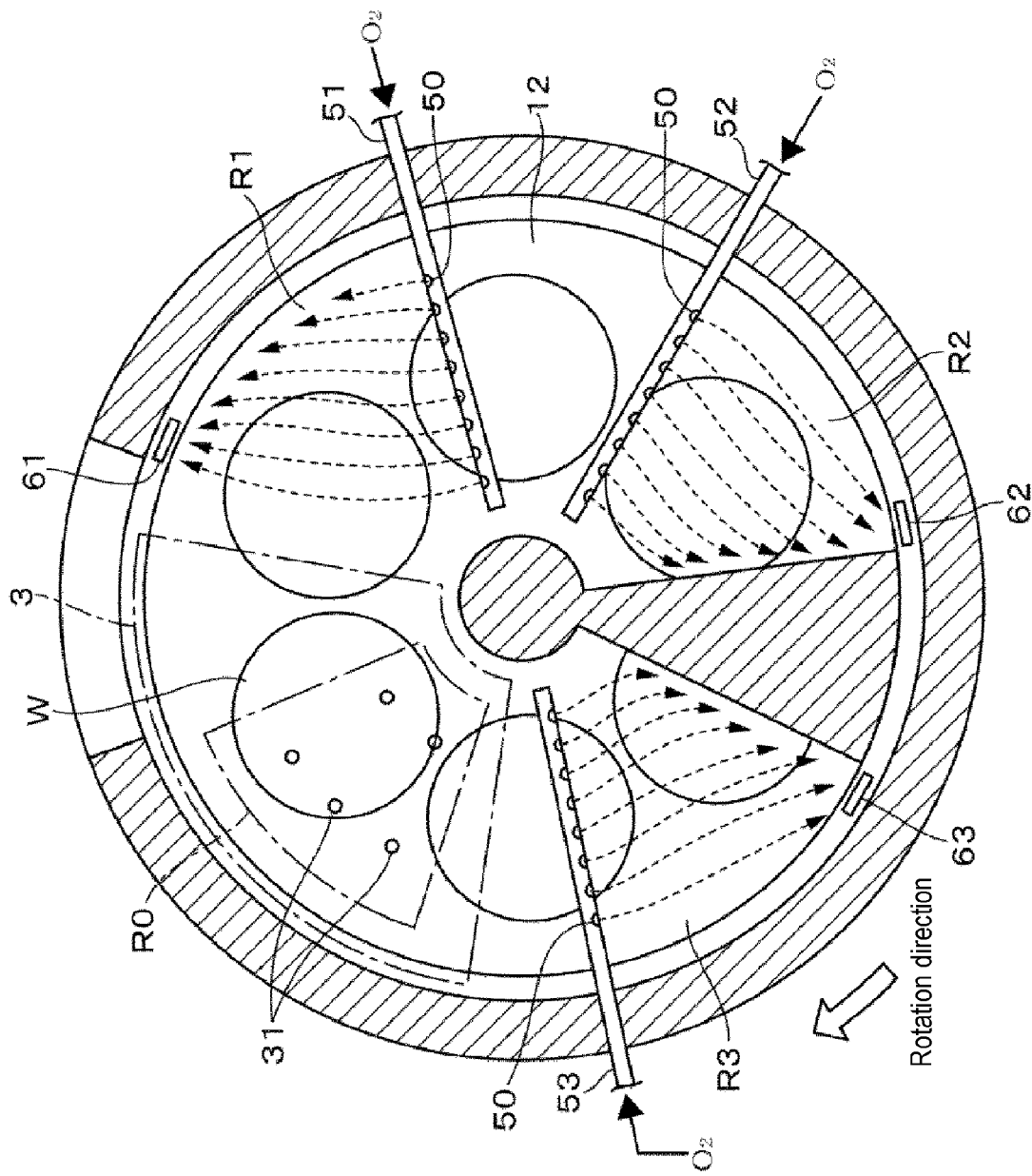
FIG. 10 is a plan view showing the film forming apparatus which is performing the oxidizing process.

Hereinafter, the process performed by the film forming apparatus 2 will be described with reference to FIGS. 9 and 10. In FIGS. 9 and 10, the flows of the respective gases supplied into the vacuum container 21 are indicated by dotted line arrows. In addition, the white arrow in the FIGS. 9 and 10 indicate the rotation direction of the rotary table 22. First, six wafers W taken out from the carrier by the substrate transfer mechanism are transported to the respective recesses 24 of the rotary table 22. This wafer W is the wafer W shown in FIG. 1A. Then, the gate valve provided in the transfer port 26 of the vacuum container 21 is closed to airtightly seal the interior of the vacuum container 21. The wafer W mounted in the recess 24 is heated by the heater 25 to, for example, 200 degrees C. to 600 degrees C., specifically 450 degrees C. or less, more specifically 250 degrees C. Then, the interior of the vacuum container 21 is brought into a vacuum atmosphere having a predetermined pressure by the exhaust from the first to third exhaust ports 61, 62 and 63, and the rotary table 22 is rotated at a predetermined rotation number.

Then, the $H_2$ gas is supplied from the gas injectors 51 and 52 to the plasma forming regions R1 and R2, respectively. The $NH_3$ gas and the $H_2$ gas are supplied from the gas injector 53 to the plasma forming region R3. While the respective gases are supplied in this manner, the microwave is supplied from the microwave generator 47, such that the microwave generates the plasma of the $H_2$ gas in the plasma forming regions R1 and R2, and the plasma of the $NH_3$ gas and $H_2$ gas in the plasma forming region R3. In the gas supply/exhaust unit 3, the DCS gas is discharged from the gas discharge ports 31, and the Ar gas is discharged from the purge gas discharge port 33. The gases are exhausted from the exhaust port 32. FIG. 9 shows a state in which the gases are supplied to the respective portions in this way.

When the wafer W is positioned in the adsorption region R0 by the rotation of the rotary table 22, the DCS gas is supplied and adsorbed to the surface of the wafer W. Subsequently, when the rotary table 22 is rotated so that the wafer W reaches the plasma forming region R3, the active species of the $NH_3$ gas contained in the plasma are supplied to the wafer W to react with the DCS gas, whereby the SiN film 13 shown in FIG. 1B is formed. In addition, the SiN film 13 is modified by the active species of the $H_2$ gas contained in the plasma. When the rotary table 22 is further rotated so that the wafer W reaches the plasma forming regions R1 and R2, the SiN film 13 is further modified by the active species of the $H_2$ gas contained in the plasma. Specifically, in this modifying process, a chlorine component derived from the DCS gas contained in a thin film is removed from the film by the action of the active species of the $H_2$ gas so that a more pure (dense) nitride film can be obtained.

The rotation of the rotary table 22 is continued and the wafer W is repeatedly moved through the adsorption region R0, the plasma forming region R1, the plasma forming region R2 and the plasma forming region R3 in order. The supply of the DCS gas, the supply of the active species of the $H_2$ gas, and the supply of the active species of the $NH_3$ gas and the $H_2$ gas are repeatedly performed. As SiN is deposited, the thickness of the SiN film 13 increases and the modifying process progresses. Then, when the thickness of the SiN film 13 (L2 in FIG. 1B) reaches a predetermined size, the discharge and exhaust of the respective gases in the gas supply/exhaust unit 3 are stopped. Meanwhile, the supply of the $H_2$ gas from the gas injectors 51 and 52 to the plasma forming regions R1 and R2 is stopped, and the $O_2$ gas is supplied from the gas injectors 51 and 52 to the plasma forming regions R1 and R2. In addition, the supply of the $NH_3$ gas and the $H_2$ gas from the gas injector 53 to the plasma forming region R3 is stopped, and the $O_2$ gas is supplied from the gas injector 53 to the plasma forming region R3. FIG. 10 shows a state in which the gases are supplied to the respective portions in this way. At this time, the wafer W is heated to, for example, 200 degrees C. to 600 degrees C., specifically 450 degrees C. or less, more specifically 250 degrees C.

The $O_2$ gas supplied to the plasma forming regions R1 to R3 in this manner is converted into plasma by the microwave supplied to the plasma forming regions R1 to R3. By the rotation of the rotary table 22, the wafer W is exposed to the plasma of the $O_2$ gas, and the surface of the SiN film 13 is oxidized, whereby the oxide layer 14 shown in FIG. 1C is formed. When the oxidizing progresses and the thickness of the oxide layer 14 (L1 in FIG. 1C) reaches a predetermined thickness, the supply of the $O_2$ gas and the supply of the microwave to the plasma forming regions R1 to R3 are stopped, respectively. Thereafter, the wafer W is unloaded from the film forming apparatus 2 by the substrate transfer mechanism.

In the process performed by the film forming apparatus 2, the oxide layer 14 is formed by the plasma of the $O_2$ gas. However, the formation of the oxide layer 14 may be performed without using plasma. For example, in a state in which the temperature of the wafer W is made relatively high by the heater 25, the $O_2$ gas is discharged from the respective gas injectors 51 to 53, and the oxide layer 14 may be formed by causing SiN and $O_2$ to react with each other. The oxidizing gas used for forming the oxide layer 14 is not limited to the $O_2$ gas but may be any gas capable of oxidizing SiN. The oxidizing gas may be an $O_3$ (ozone) gas or an NO (nitrogen monoxide) gas. After forming the SiN film 13 and forming the oxide layer 14 as described above, a SiN film 13 may be further formed on the oxide layer 14, and the surface of the SiN film 13 may be oxidized to form the oxide layer 14. That is, when seen in the vertical direction, the SiN film 13 and the oxide layer 14 may be alternately and repeatedly laminated.

The apparatus for forming the SiN film 13 and the oxide layer 14 is not limited to the above-described configuration example but may be, for example, a single-wafer type apparatus in which gas processing is performed by mounting the wafer W one by one on a stage provided inside the vacuum container 21. In addition, the SiN film 13 and the oxide layer 14 may be formed by using an apparatus which is provided with a vertical vacuum container for storing a substrate holder for holding a plurality of wafers W arranged in the vertical direction and which is capable of performing gas processing on the plurality of wafers W in a batch by supplying each film forming gas and oxidizing gas into the vacuum container. Furthermore, the formation of the SiN film 13 is not limited to being performed by ALD but may be performed by CVD (Chemical Vapor Deposition).

In addition, the process of forming the SiN film 13 and the process of forming the oxide layer 14 may be performed in separate vacuum containers 21. However, when the surface of the SiN film 13 is exposed to the air atmosphere after the formation of the SiN film 13 and before the formation of the oxide layer 14, there is a possibility that an oxide layer having low denseness is formed on the surface of the SiN film 13 due to the air atmospheric atmosphere. If such an oxide layer is formed, there is a possibility that an oxide layer having high denseness cannot be formed even if an oxidizing process with $O_2$ plasma is performed as described above. Accordingly, after the formation of the SiN film 13, it is preferable not to unload the wafer W from the vacuum atmosphere until the oxide layer 14 is formed. The film forming apparatus 2 described above is preferred because the wafer W is not unloaded from the vacuum atmosphere until the oxide layer 14 is formed in this way. Alternatively, after the formation of the SiN film 13, the wafer W may be transferred to a vacuum container different from the vacuum container 21 of the film forming apparatus 2 via a transfer path having a vacuum atmosphere, and an oxidizing process may be performed in a vacuum container which is the transfer destination.

Figure 11:
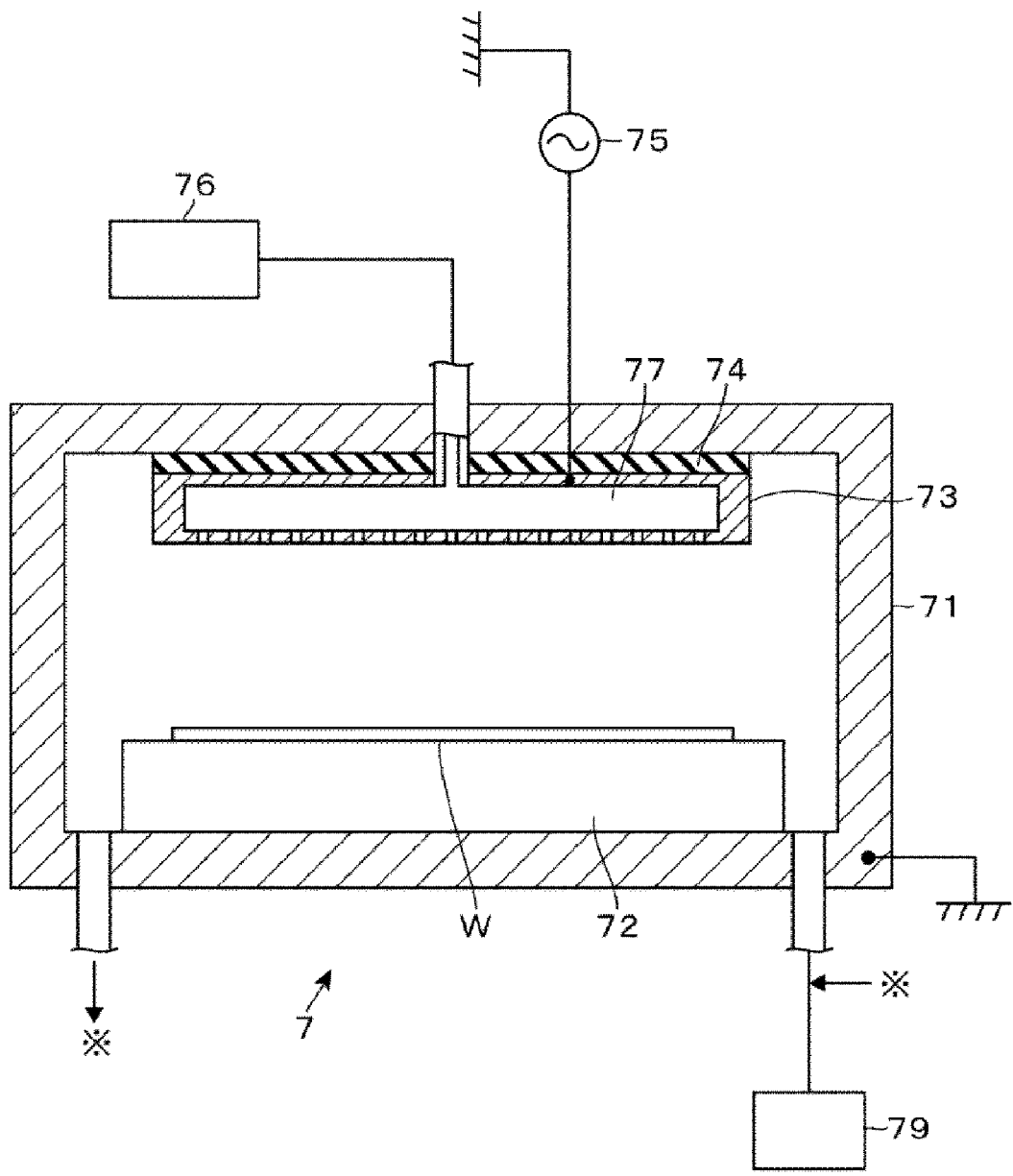
FIG. 11 is a vertical sectional side view of an etching apparatus for performing an etching process in the processing steps.

Subsequently, an example of the etching apparatus 7 will be described. The etching apparatus 7 shown in FIG. 11 forms capacitively-coupled plasma and performs an etching process. Reference numeral 71 in FIG. 11 denotes a grounded processing container. The interior of the processing container 71 is evacuated by an exhaust mechanism 79 so that a vacuum atmosphere of a predetermined pressure is formed. Reference numeral 72 in FIG. 11 denotes a mounting table on which a wafer W is mounted. A heater (not shown) for heating the wafer W is buried in the mounting table 72. The mounting table 72 is electrically connected to and disposed on a bottom surface of the processing container 71. The mounting table 72 serves as a lower electrode and functions as an anode electrode.

A shower head 73 is provided above the mounting table 72 so as to face an upper surface of the mounting table 72. Reference numeral 74 in FIG. 11 denotes an insulating member, which insulates the shower head 73 from the processing container 71. A high frequency power source 75 for generating plasma is connected to the shower head 73. The shower head 73 functions as a cathode electrode. Reference numeral 76 in FIG. 11 denotes a gas supply part, which independently supplies an etching gas used for etching the above-described respective films into a diffusion space 77 provided in the shower head 73. The etching gas supplied into the diffusion space 77 is supplied to the wafer W from discharge holes of the shower head 73. When the etching gas is supplied to the wafer W in this manner, the high frequency power source 75 is turned on. An electric field is formed between the electrodes, and the etching gas is converted into plasma, whereby the etching of the film on the surface of the wafer W is performed. As described with reference to FIG. 2B, when etching the TiN film 12, a Cl (chlorine)-based gas as an etching gas is supplied to the shower head 73 from the gas supply part 76, whereby processing is performed.

However, when etching the TiN film 12, instead of the Cl-based gas, an F-based gas containing F (fluorine) such as $SF_6$ (sulfur hexafluoride), $C_4F_8$ (octafluorocyclobutane), $CF_4$ (carbon tetrafluoride) or the like and a Br-based gas containing Br (bromine) such as HBr (hydrogen bromide) or the like may also be used. Even in the case where the F-based gas and the Br-based gas are used as the etching gas, the etching of the SiN film 13 can be suppressed by forming the oxide layer 14 as described above. Accordingly, a halogen gas containing halogen alone or a halogen compound can be used as the etching gas. Incidentally, the language "containing halogen alone or a halogen compound" does not mean that the halogen gas contains halogen alone or a halogen compound as an impurity, but means that the halogen gas contains halogen alone or a halogen compound as a main component.

Although there has been described an example in which the TiN film 12 is etched as an etching target film, the etching target film may be any film which is etched by halogen alone or a halogen compound. For example, instead of TiN, TaN (tantalum nitride) may be an etching target film. The etching of the etching target film may be performed without converting the etching gas into plasma.

Incidentally, the SiN film 13 may be added with an element other than Si and N, such as boron or carbon. Accordingly, the oxide layer 14 formed by oxidizing the SiN film 13 may also contain boron or carbon.

When etching the TiN film 12 as described above, the TiN film 12 is not necessarily located under the SiN film 13. The present disclosure may also be applied to a case where the TiN film 12 is removed by etching the wafer W having a configuration in which the TiN film 12 is positioned above the SiN film 13 and is exposed on the surface of the wafer W, an opening is formed in the TiN film 12, and the SiN film 13 is exposed through the opening. That is, by oxidizing the surface of the SiN film 13 exposed through the opening, it is possible to prevent the SiN film 13 from being etched. In this case, the oxidizing may be performed before the TiN film 12 is formed, or may be performed after the opening is formed in the TiN film 12 to expose the SiN film 13. It is to be noted that the present disclosure is not limited to the embodiments described above, and the respective embodiments may be appropriately changed or combined.

[Evaluation Test]

Hereinafter, evaluation tests conducted in connection with the present disclosure will be described.

Evaluation Test 1

As evaluation test 1, the supply of the respective gases and the formation of the plasma were carried out as described with reference to FIG. 9 using the above-described film forming apparatus 2 to form the SiN film 13 on the wafer W. Thereafter, the supply of the respective gases and the formation of the plasma were carried out as described with reference to FIG. 10 to oxidize the surface of the SiN film 13. Then, an oxygen concentration at each depth from the surface of the wafer W was measured by SIMS (Secondary Ion Mass Spectrometry). As comparative test 1, the SiN film 13 was formed in the same manner as in evaluation test 1, and SIMS was performed in the same manner as in evaluation test 1 without performing the oxidizing process described with reference to FIG. 10, thereby measuring an oxygen concentration.

Figure 12:
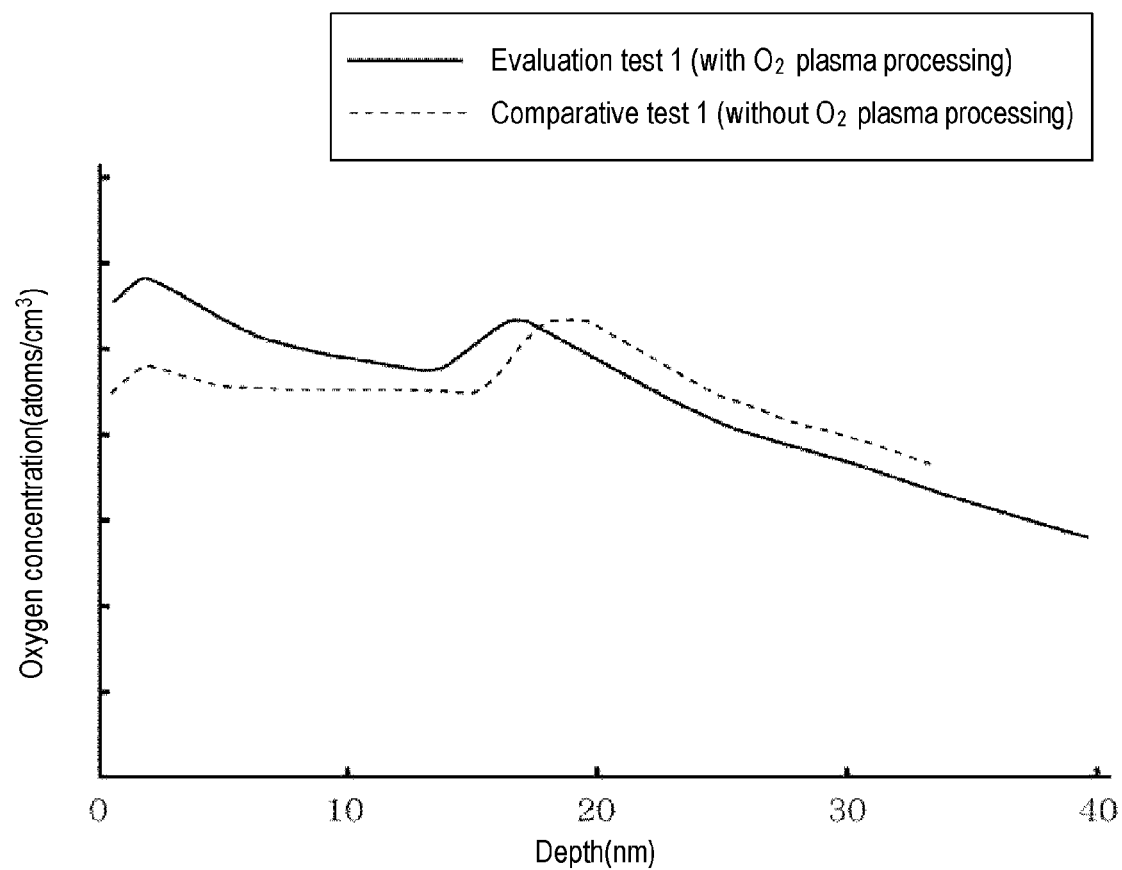
FIG. 12 is a graph showing the results of evaluation tests.

In the graph of FIG. 12, the result of evaluation test 1 is shown by a solid line, and the result of comparative test 1 is shown by a dotted line. The vertical axis of the graph represents the oxygen concentration (unit: atoms/cm$^3$). In this vertical axis, the amount of oxygen concentration between adjacent graduations is the same between the respective graduations, and the upper graduation indicates that the oxygen concentration is larger. The horizontal axis of the graph represents the depth (unit: nm) from the surface of the wafer W. As shown in the graph, in the range where the depth is greater than 0 nm and 20 nm or less, the oxygen concentration is larger in evaluation test 1. Accordingly, it was confirmed from evaluation test 1 that by exposing the SiN film 13 to the plasma of the $O_2$ gas, the surface of the SiN film 13 is oxidized and the oxide layer 14 can be formed.

Evaluation Test 2

As evaluation test 2, a plurality of test pieces in which the TiN film 12 is formed on the surface of the wafer W so that only a part of the TiN film 12 is covered on the surface of the wafer is prepared. A plasma etching process was performed using an etching apparatus shown in FIG. 11 so that the TiN film 12 is etched by 10 nm. The etching amount of each test piece was measured. Further, an etching selection ratio of each test piece was measured. The etching selection ratio is obtained by dividing the etching amount of the test piece by the etching amount of the TiN film 12(=10 nm).

Four of the test pieces are denoted as test pieces 1 to 4. The surface of test piece 1 is composed of the SiN film 13 formed by heating the wafer W to 250 degrees C. and processing the wafer W by the film forming apparatus 2. However, the oxide layer 14 is not formed on the surface of the SiN film 13 of the test piece 1. The surface of test piece 2 is composed of the SiN film 13 formed by heating the wafer W to 250 degrees C. and processing the wafer W by the film forming apparatus 2. The oxide layer 14 is formed on the surface of the SiN film 13 of the test piece 2. The surface of test piece 3 is composed of the SiN film 13 formed by heating the wafer W to 450 degrees C. and processing the wafer W by the film forming apparatus 2. On the surface of the SiN film 13 of the test piece 3, the oxide layer 14 is not formed just like test piece 1. The surface of test piece 4 is composed of the SiN film 13 formed by heating the wafer W to 550 degrees C. and performing CVD.

Describing the conditions of the above plasma etching process, the etching gas used is a mixed gas of a $Cl_2$ gas and an Ar gas. The pressure inside the processing container 71 during the etching process is 10 mTorr. In addition, the supplied power of the high frequency power source 75 is 135 MW, the heating temperature of the wafer W is 40 degrees C., and the etching process time is 15 seconds.

Figure 13:
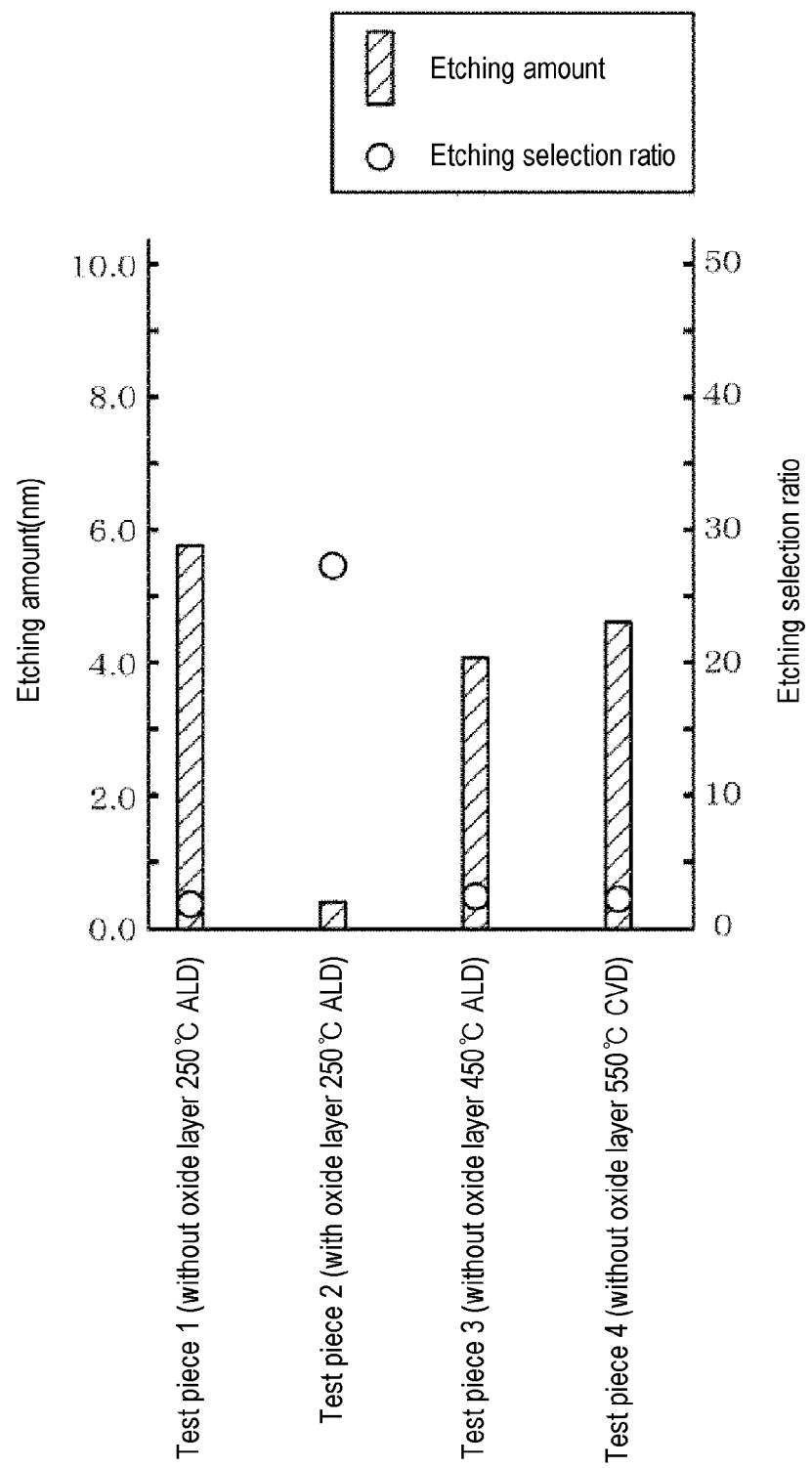
FIG. 13 is a graph showing the results of evaluation tests.

In FIG. 13, the etching amount of each test piece is indicated by a bar graph and the etching selection ratio is indicated by a circle plot. As is apparent from FIG. 13, test piece 2 having the oxide layer 14 formed thereon is smaller in the etching amount of the test piece and larger in the etching selection ratio than test pieces 1, 3 and 4 in which the oxide layer 14 is not formed. Comparing test pieces 1 and 2 which differ only in the presence or absence of the oxide layer 14, the etching selection ratio of test piece 2 is 27 times as large as the etching selection ratio of test piece 1. In evaluation test 2, in addition to the above-mentioned test pieces 1 to 4, the SiN films to which one or more elements selected from boron, carbon and oxygen are added and in which an oxide layer is not formed were used as additional test pieces to acquire the etching amount and the etching selection ratio. The etching amount of test piece 2 is smaller than the etching amount of the additional test pieces, and the etching selection ratio of test piece 2 is larger than the etching selection ratios of the additional test pieces. Accordingly, the effect of the present disclosure that the etching of the SiN film 13 can be suppressed by forming the oxide layer 14 was confirmed from evaluation test 2.

Evaluation Test 3

In evaluation test 3, the SiN film 13 and the oxide layer 14 were formed on the wafer W, and the etching described in evaluation test 2 was performed. Before and after performing this etching, the vertical sectional side surface of the wafer W was imaged by TEM (Transmission Electron Microscope). In comparative test 3, the SiN film 13 was formed on the wafer W, and the etching described in evaluation test 2 was performed without forming the oxide layer 14. Also in comparative test 3, the vertical sectional side surface of the wafer W was imaged by TEM before and after the etching.

In the wafer W of evaluation test 3, the thickness of the SiN film 13 was 20.3 nm before the etching, and the thickness of the SiN film 13 was 19.8 nm after the etching. In addition, it was confirmed that the oxide layer 14 is formed on the SiN film 13 before the etching. In the wafer W of comparative test 3, the thickness of the SiN film 13 was 22.3 nm before the etching, and the thickness of the SiN film 13 was 16.4 nm after the etching. As described above, the etching amount of the SiN film 13 in the wafer W of evaluation test 3 is reduced as compared with the wafer W of comparison test 3. The effect of the present disclosure was confirmed also from evaluation test 3.

According to the present disclosure, after forming a silicon nitride film on a substrate, the surface of the silicon nitride film is oxidized to form an oxide layer. Thereafter, an etching target film is etched using an etching gas including a halogen gas in a state in which the etching target film and the oxide layer are exposed on the surface of the substrate. This makes it possible to suppress the etching of the silicon nitride film by the etching gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
    forming a silicon nitride film having a thickness L2 and that is laminated on a titanium nitride film by supplying a film forming gas to a Si substrate;
    oxidizing a surface of the silicon nitride film to form a silicon oxynitride layer having a thickness L1 by supplying an oxidizing gas to the surface of the silicon nitride film;
    after the oxidizing the surface of the silicon nitride film, alternately laminating an additional silicon nitride film and an additional silicon oxynitride layer on the siliconoxynitride layer by alternately repeating the forming the silicon nitride film and the oxidizing the surface of the silicon nitride film a plurality of times;
    forming an opening in the silicon nitride film and the silicon oxynitride layer by partially etching the silicon nitride film and the silicon oxynitride layer along a resist pattern until a portion of the titanium nitride film is exposed on a surface of the Si substrate;
    removing the resist pattern; and
    after the removing the resist pattern, etching the exposed titanium nitride film by supplying an etching gas containing halogen to expose the surface of the Si substrate while the remaining silicon oxynitride layer covers the remaining silicon nitride film,
    wherein a thickness ratio of L1/L2 is equal to or smaller than 1/3, and is larger than 0.

2. The method of claim 1, wherein the silicon nitride film is a mask for etching the titanium nitride film.

3. The method of claim 1, wherein the etching gas is a chlorine-based gas.

4. The method of claim 1, wherein the oxidizing gas is an oxygen gas, and
   wherein the oxidizing a surface of the silicon nitride film includes supplying the oxygen gas converted into plasma to the substrate.

\* \* \* \* \*